United States Patent
Van Sleet et al.

(10) Patent No.: US 6,817,442 B2
(45) Date of Patent: Nov. 16, 2004

(54) ACOUSTICALLY INSULATED BEZEL

(75) Inventors: Donovan Van Sleet, Spanaway, WA (US); Robin A. Steinbrecher, Olympia, WA (US); Casey Winkel, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 10/112,629

(22) Filed: Mar. 29, 2002

(65) Prior Publication Data

US 2003/0183448 A1 Oct. 2, 2003

(51) Int. Cl.⁷ .............................. E04B 1/82; E04B 1/84
(52) U.S. Cl. ...................... 181/293; 181/284; 181/290; 181/294; 52/144; 52/145
(58) Field of Search ................... 181/284–294; 361/678, 690, 692, 694, 831, 521

(56) References Cited

U.S. PATENT DOCUMENTS

| | | | | |
|---|---|---|---|---|
| 3,022,607 A | * | 2/1962 | Toulmin, Jr. .................. | 52/145 |
| 3,769,767 A | * | 11/1973 | Scott ........................... | 52/145 |
| 3,770,560 A | * | 11/1973 | Elder et al. .................. | 428/138 |
| 3,819,007 A | * | 6/1974 | Wirt et al. ................... | 181/286 |
| 4,128,682 A | | 12/1978 | Nomura et al. | |
| 4,128,683 A | | 12/1978 | Nomura et al. | |
| 4,129,672 A | | 12/1978 | Momura et al. | |
| 4,263,356 A | * | 4/1981 | Nomura et al. ............. | 428/138 |
| 4,410,065 A | * | 10/1983 | Harvey ........................ | 181/224 |
| 4,441,580 A | * | 4/1984 | Webster ....................... | 181/286 |
| 4,516,656 A | * | 5/1985 | Fleshler ....................... | 181/175 |
| 4,607,466 A | * | 8/1986 | Allred ......................... | 52/144 |
| 5,504,281 A | * | 4/1996 | Whitney et al. ............. | 181/286 |
| 5,512,715 A | * | 4/1996 | Takewa et al. .............. | 181/295 |
| 5,658,656 A | * | 8/1997 | Whitney et al. ............ | 428/304.4 |
| 5,867,957 A | * | 2/1999 | Holtrop ....................... | 52/403.1 |
| 5,997,985 A | * | 12/1999 | Clarke et al. ................ | 428/116 |
| 6,021,612 A | * | 2/2000 | Dunn et al. .................. | 52/144 |
| 6,243,262 B1 | * | 6/2001 | Koo et al. ................... | 361/687 |
| 6,391,438 B1 | * | 5/2002 | Ramesh et al. ........... | 428/319.7 |

FOREIGN PATENT DOCUMENTS

JP          05237963 A  *  9/1993  ............. B32B/3/26

* cited by examiner

*Primary Examiner*—Kimberly Lockett
*Assistant Examiner*—Patrick Miller
(74) *Attorney, Agent, or Firm*—Cynthia T. Faatz

(57) ABSTRACT

A portion of a chassis comprised of a material forming a portion of the exterior of the chassis and a high-density flexible material adjacent an inner surface of the portion of the chassis with air holes formed contiguously through both the portion of the chassis and the high-density flexible material.

32 Claims, 6 Drawing Sheets

ACOUSTICALLY INSULATED BEZEL

FIELD OF THE INVENTION

Apparatus and method to reduce noise levels from active cooling of an electronic device are disclosed.

ART BACKGROUND

Computer systems continue to increase in performance and capability as ever faster processors, memory and other components are created. However, these increases in performance and capability often come with the requirement of higher power consumption that are frequently accompanied by higher heat dissipation by components within the computer system.

With the higher heat dissipation often comes the need to employ apparatus to cool such computer systems with higher capacities for removing heat generated within such computer systems. A very common form of cooling system is the use of one or more fans or blowers to cause ambient air from the environment external to the computer system to flow through the chassis of a computer system. To achieve higher capacities for removing heat with such a form of cooling system often requires causing greater quantities of ambient air to flow through a computer system.

The flow of air through the chassis of a computer system often entails forcing air to flow through a winding path of components within the computer chassis. The friction between the air molecules and the surfaces of both the components within the computer system the blades of the fan or blower used to effect air movement generates an audible hiss-like sound or so-called "white noise." As more air must be moved to remove more heat in higher performing computer systems, this noise has started to reach undesirable levels.

BRIEF DESCRIPTION OF THE DRAWINGS

Objects, features, and advantages will be apparent to one skilled in the art in view of the following detailed description in which.

DETAILED DESCRIPTION

In the following description, numerous details are set forth in order to provide a thorough understanding for purposes of explanation, however, it will be apparent to one skilled in the art that these specific details are not required in order to practice the invention as hereinafter claimed.

Various embodiments are discussed using various materials in the vicinity of air passageways of a computer chassis to dampen noises generated principally, but not exclusively, by the flow of air to cool a computer. Specifically, an embodiment concerns using a high-density flexible material or an open-cell material behind a bezel or other exterior portion of a computer chassis in which air passages are formed to reduce the emission of noise from within a computer system to the environment external to the computer system. However, although the discussion is in reference to computer systems, it is also applicable to other devices or machinery having air passages to enable the flow of air between the interior and exterior of a device or machine.

Figure 1:
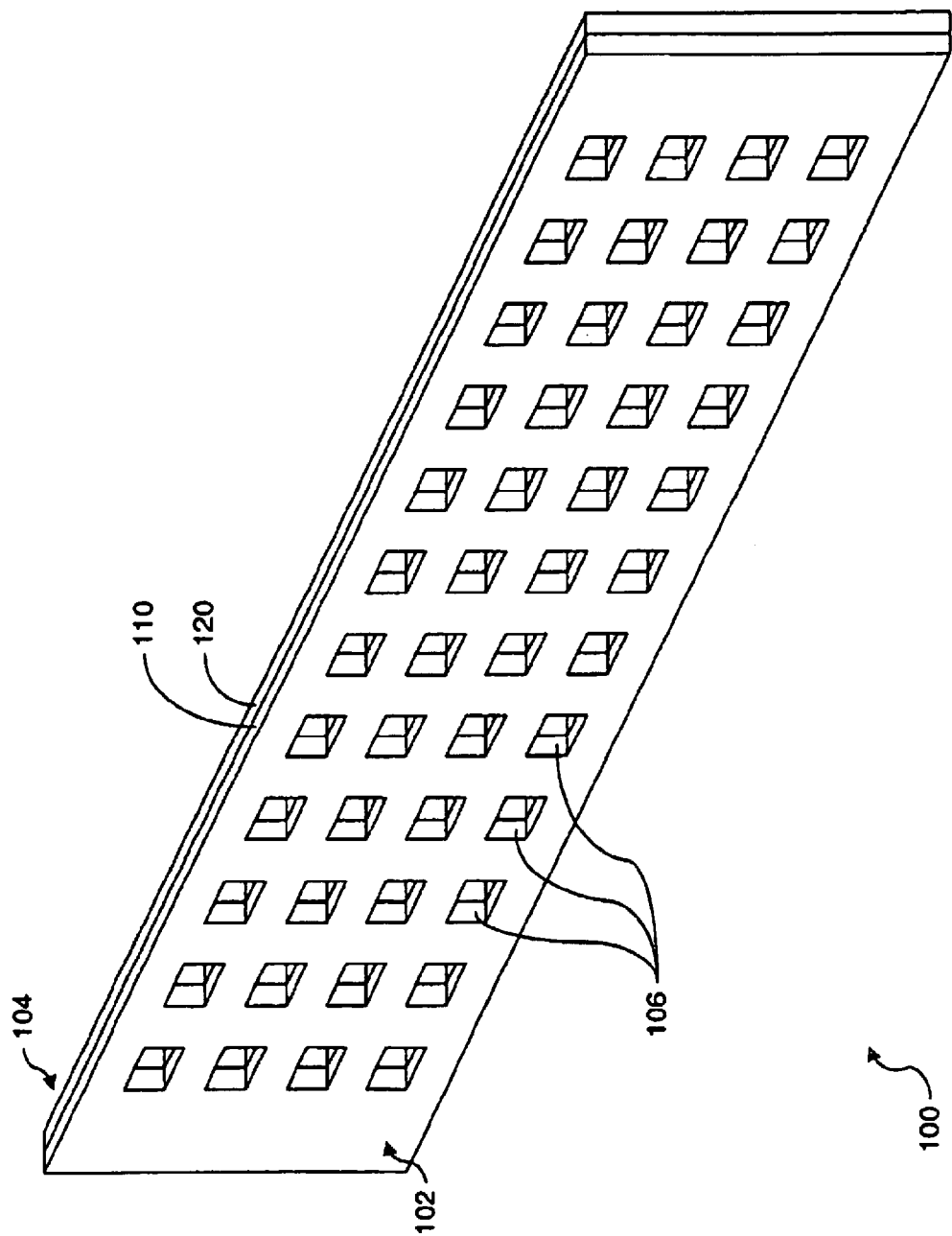
FIG. 1 is a perspective view of a bezel of an embodiment.

FIG. 1 is a perspective view depicting features of an embodiment. Bezel 100 is a portion of the exterior of a chassis (not shown) of a device using airflow through the chassis of the device to cool internal components of the device. As shown in this embodiment, bezel 100 is substantially flat and is formed of two layers of material. The outer layer (i.e., the layer that forms part of the exterior of the chassis when bezel 100 is installed thereon) is comprised of plate 110, and provides bezel 100 with an outer face 102 that becomes part of the visible exterior of a chassis when bezel 100 is installed. The inner layer is comprised of rubber sheet 120, and provides bezel 100 with an inner face 104 (not visible given the perspective shown) that is on the side of bezel 100 that is substantially opposite that of outer face 102. In one embodiment, rubber sheet 120 is bonded to plate 110 with adhesive. In another embodiment, a frame (not shown) used to mount bezel 100 engages the peripheral edges of plate 110 and rubber sheet 120, and hold plate 110 and rubber sheet 120 in contact with each other. A plurality of air holes 106 are formed and provide substantially contiguous channels through both plate 110 and rubber sheet 120 of bezel 100, penetrating both outer face 102 and inner face 104.

Plate 110 is typically made of some form of plastic, metal, composite, ceramic, wood, etc., depending on the material preferred for use on the given portion of the exterior of a chassis of which bezel 100 is a part. In one possible embodiment, bezel 100 is shaped and sized to cover the otherwise open front of a disk drive bay of a typical computer system, in which case, it is likely that plate 110 would be installed on the front of the chassis of a computer system, and therefore, since many typical computer systems use plastic for the front of the chassis, plate 110 of bezel 100 would likely be made of plastic.

Rubber sheet 120 is made from a high-density flexible material such as rubber, or such as a plastic, polymer or other high-density foam material with some physical characteristics similar to rubber. In one embodiment, rubber sheet 120 is made of a material effective at reflecting sound waves of frequencies generally throughout the range of 500 Hz to 5 KHz, which is believed to be a range of frequencies to which the human ear is more sensitive.

When bezel 100 is installed as part of the exterior of a chassis of a device, inner face 104 is positioned so as to face in the general direction of components within the chassis. As air is forced around surfaces of components within such a chassis, sound waves are generated that radiate from such component surfaces and towards the exterior of the chassis. Other sound waves may well be generated by one or more of the components, themselves, within such a chassis, including but not limited to, fans, blowers, disk drives, power transformers, etc. Some of these sound waves reach bezel 100 and strike inner face 104 provided by rubber sheet 120. Rubber sheet 120 reflects a significant amount of these sound waves back towards the interior of the chassis. The flexible characteristic of the material of rubber sheet 120 dampens the energy of these reflected sound waves such that if some of these reflected sound waves eventually reach the environment external to the chassis where they might be audible, the reduced energy of such reflected sound waves results in their being audible at a reduced volume. The flexible characteristic of the material of rubber sheet 120 also provides a degree of mechanical isolation between inner face 104 and plate 110, allowing inner face 104 to vibrate as would normally be expected in response to sound waves striking inner face 104, while preventing a significant amount of this vibration from reaching plate 110. Preventing such vibration from reaching plate 110 aids in preventing plate 110 from also vibrating and thereby retransmitting sound waves into the environment external to the chassis where they might be audible.

Although air holes 106 could be of almost any conceivable size, shape or placement across inner face 104, as more of the otherwise available surface area of inner face 104 is lost to air holes 106, there is less surface area of inner face 104 present to reflect sound waves back towards the interior of the chassis into which bezel 100 is installed. This may require a tradeoff between the amount of air flow desired through bezel 100 and the degree to which bezel 100 is effective in preventing noise generated within a chassis from being heard outside the chassis.

Figure 2:
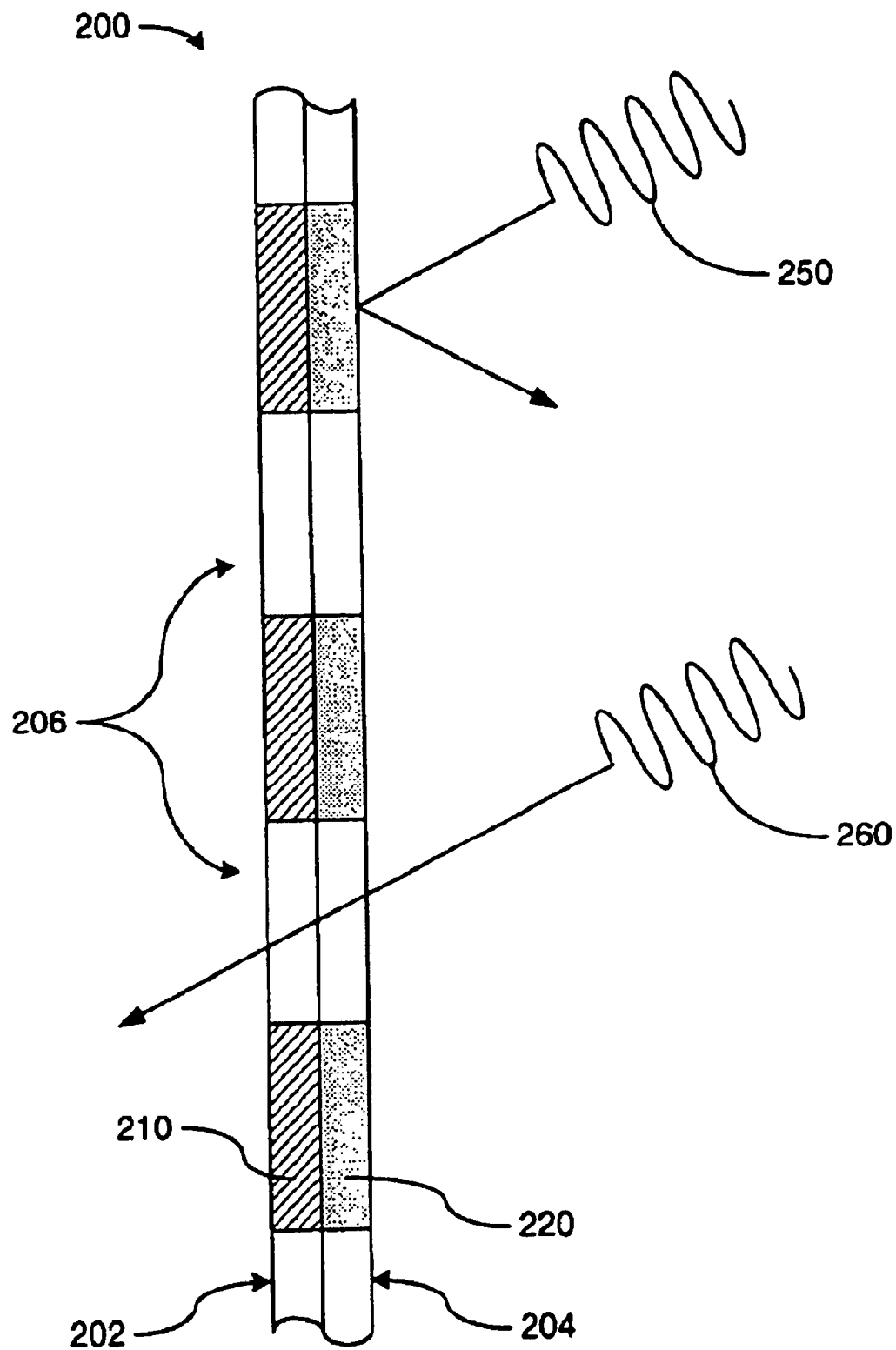
FIG. 2 is a cross sectional view of a part of a chassis of an embodiment.

FIG. 2 is a cross sectional view depicting features of an embodiment. Chassis section 200 is a portion of the exterior of a chassis of a device using airflow through the chassis of the device to cool internal components of the device. In a manner corresponding generally to bezel 100 depicted in FIG. 1, chassis section 200 is formed of two layers of material. The outer layer is comprised of chassis material 210 with an outer face 202 that is part of the visible exterior of the chassis. The inner layer is comprised of rubber sheet 220, and provides chassis section 200 with an inner face 204 that is on the side of chassis section 200 that is substantially opposite that of outer face 202. In one embodiment, rubber sheet 220 is attached with adhesive to chassis material 210, while in an alternative embodiment, fasteners are used. A plurality of air holes 206 are formed and provide substantially contiguous channels through both chassis material 210 and rubber sheet 220 of chassis section 200, penetrating both outer face 202 and inner face 204.

Chassis material 210 is typically some form of plastic, metal, composite, ceramic, wood, etc., depending on the material preferred for use on the given portion of the exterior of the chassis of which chassis portion 200 is a part. If chassis portion 200 is part of the front of the chassis of many typical computer systems or other electrical devices, it is likely that chassis material 210 would be plastic. If chassis portion 200 is part of one of the sides or rear of the chassis of many typical computer systems or other electrical devices, it is likely that chassis material 210 would be metal.

Rubber sheet 220 is made from a high-density flexible material such as rubber, or such as a plastic, polymer or other high-density foam material with some physical characteristics similar to rubber. In one embodiment, rubber sheet 220 is made of a material effective at reflecting sound waves of frequencies generally throughout the range of 500 Hz to 5 KHz, which is believed to be a range of frequencies to which the human ear is more sensitive.

Inner face 204 is positioned so as to face in the general direction of components within the chassis. As air is forced around surfaces of components within such a chassis, sound waves are generated that radiate from such component surfaces and towards the exterior of the chassis. Other sound waves may well be generated by one or more of the components, themselves, within such a chassis, including but not limited to, fans, blowers, disk drives, power transformers, etc.

Some of such sound waves, such as sound wave 260, pass through one of holes 206, reaching the environment external to the chassis and thereby possibly becoming audible. However, others of such sound waves, such as sound wave 250, reach chassis section 200 and strike inner face 204 provided by rubber sheet 220. Rubber sheet 220 reflects a significant amount of sound wave 250 back towards the interior of the chassis. The flexible characteristic of the material of rubber sheet 220 dampens the energy of sound wave 250 such that if, after being reflected by rubber sheet 220, sound wave 250 eventually reaches the environment external to the chassis where sound wave 250 might be audible, the reduced energy of sound wave 250 results in sound wave 250 having a reduced volume. The flexible characteristic of the material of rubber sheet 220 also provides a degree of mechanical isolation between inner face 204 and chassis material 210, allowing inner face 204 to vibrate as would normally be expected in response to being struck by sound wave 250, while preventing a significant amount of this vibration from reaching chassis material 210. Preventing such vibration from reaching chassis material 210 aids in preventing chassis material 210 from also vibrating and thereby retransmitting sound wave 250 into the environment external to the chassis, thereby possibly becoming audible.

As was the case with air holes 106 of bezel 100, air holes 206 could be of almost any conceivable size, shape or placement across inner face 204. However, as more of the otherwise available surface area of inner face 204 is lost to air holes 206, there is less surface area of inner face 204 present to reflect sound waves back towards the interior of the chassis into which bezel 200 is installed. This may require a tradeoff between the amount of air flow desired through chassis section 200 and the degree to which chassis section 200 is effective in preventing noise generated within a chassis from being heard outside the chassis. In one embodiment, air holes 206 are grouped such that a higher proportion of inner face 204 is intact at a point where an intact portion inner face 204 is more effective in reflecting a greater quantity of sound waves. In another embodiment, air holes 206 are substantially evenly spread across the surface of inner face 204, thereby allowing the whole of inner face 204 to be more evenly effective in reflecting sound waves.

Figure 3:
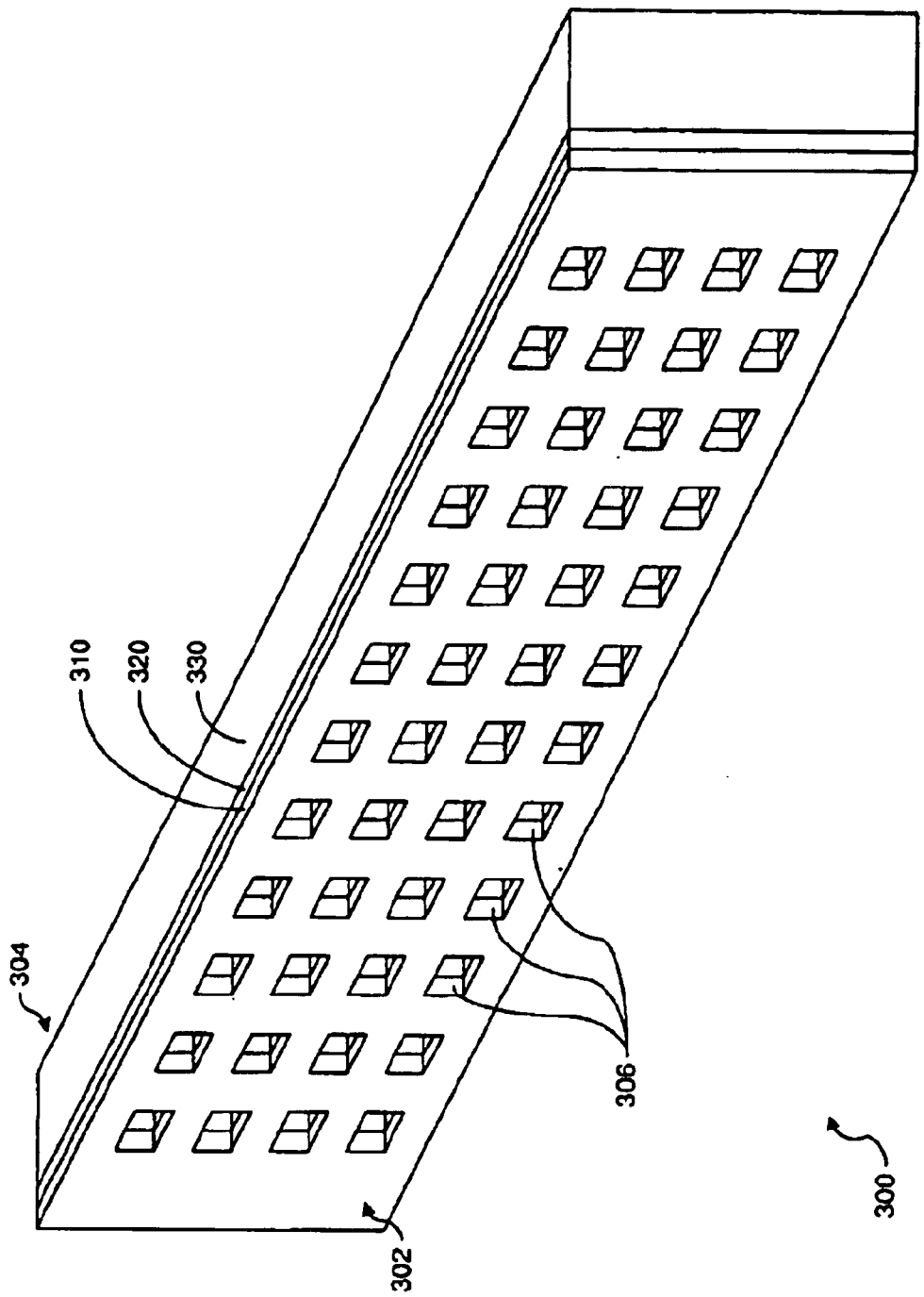
FIG. 3 is a perspective view of a bezel of another embodiment.

FIG. 3 is a perspective view depicting features of another embodiment. Somewhat like bezel 100 of FIG. 1, bezel 300 is a portion of the exterior of a chassis (not shown) of a device using airflow through the chassis of the device to cool internal components of the device. As shown in this embodiment, bezel 300 is substantially flat and is formed of three layers of material. The outer layer (i.e., the layer that forms part of the exterior of the chassis when bezel 300 is installed thereon) is comprised of plate 310, and provides bezel 300 with an outer face 302 that becomes part of the visible exterior of a chassis when bezel 300 is installed. The middle layer (i.e., the next layer) is comprised of rubber sheet 320. The inner layer is comprised of foam sheet 330 and provides bezel 300 with an inner face 304 (not visible given the perspective shown) that is on the side of bezel 300 that is substantially opposite that of outer face 302. In one embodiment, rubber sheet 320 is bonded to plate 310 and foam sheet 330 is bonded to rubber sheet 320 with adhesive. A plurality of air holes 306 are formed and provide substantially contiguous channels through plate 310, rubber sheet 320 and foam sheet 330, penetrating both outer face 302 and inner face 304.

As was the case with plate 110 of bezel 100, plate 310 is typically made of some form of plastic, metal, composite, ceramic, wood, etc., depending on the material preferred for use on the given portion of the exterior of a chassis of which bezel 300 is a part. In one possible embodiment, bezel 300 is part of a door to a rack chassis, i.e., a cabinet used to house multiple devices such as computer systems, audio/visual equipment, telecommunications equipment, networking equipment, etc.

As was the case with rubber sheet 120 of bezel 100, rubber sheet 320 could be made from rubber or from some form of plastic, polymer or other high-density foam material with some physical characteristics similar to rubber. In one embodiment, rubber sheet 320 is made of a material effective at reflecting sound waves of frequencies generally throughout the range of 500 Hz to 5 KHz, which is believed to be a range of frequencies to which the human ear is more sensitive.

Foam sheet 330 could be made from an open-cell type of foam material or other open-cell material, or that might commonly be described as being somewhat "sponge-like" in its consistency. In one embodiment, foam sheet 330 is made of a material effective in absorbing, or at least attenuating, sound waves of frequencies generally throughout the range of 500 Hz to 5 KHz, which is believed to be a range of frequencies to which the human ear is more sensitive.

When bezel 300 is installed as part of the exterior of a chassis of a device, inner face 304 is positioned so as to face in the general direction of components within the chassis. As air is forced around surfaces of components within such a chassis, sound waves are generated that radiate from such component surfaces and towards the exterior of the chassis. Other sound waves may well be generated by one or more of the components, themselves, within such a chassis, including but not limited to, fans, blowers, disk drives, power transformers, etc.

Some of these sound waves reach bezel 300 and strike inner face 304 provided by foam sheet 320. Foam sheet 330 absorbs a significant amount of these sound waves by dispersing their energy among the open-celled material of foam sheet 330. However, some of these sound waves may have sufficient energy so that some portion may be able to penetrate all the way through foam sheet 330 and reach rubber sheet 320. A significant amount of those sound waves that penetrate that far through foam sheet 330 are reflected by rubber sheet 320 back into foam sheet 330 where they are further absorbed by the open-celled material of foam sheet 330. The flexible characteristic of the material of rubber sheet 320 dampens the energy of these reflected sound waves, thereby further reducing their energy as they are reflected. The flexible characteristic of the material of rubber sheet 320 also provides a degree of mechanical isolation between the surface of rubber sheet 320 that is in contact with foam sheet 330 and plate 310, allowing this surface of rubber sheet 320 to vibrate as would normally be expected in response to sound waves striking it, while preventing a significant amount of this vibration from reaching plate 310. Preventing such vibration from reaching plate 310 aids in preventing plate 310 from also vibrating and thereby retransmitting sound waves into the environment external to the chassis where they might be audible. Furthermore, although some sound waves may have sufficient energy so that some portion may be able to penetrate all the way through foam sheet 330, be reflected by rubber sheet 320, and then be able to penetrate all the way back through foam sheet 330, such sound waves will have considerably reduced energy such that if they eventually reach the environment external to the chassis where they might be audible, their reduced energy results in their being audible at a considerably reduced volume.

Although air holes 306 could be of almost any conceivable size, shape or placement across inner face 304, greater quantities and/or greater sizes of air holes 306 necessarily results in less volume of material of foam sheet 330 being present to absorb sound waves, and results in less reflective surface area being provided by rubber sheet 320 to reflect sound waves. This circumstance may require that a tradeoff between the amount of air flow desired through bezel 300 and the degree to which bezel 300 is effective in preventing noise generated within a chassis from being heard outside the chassis.

Figure 4:
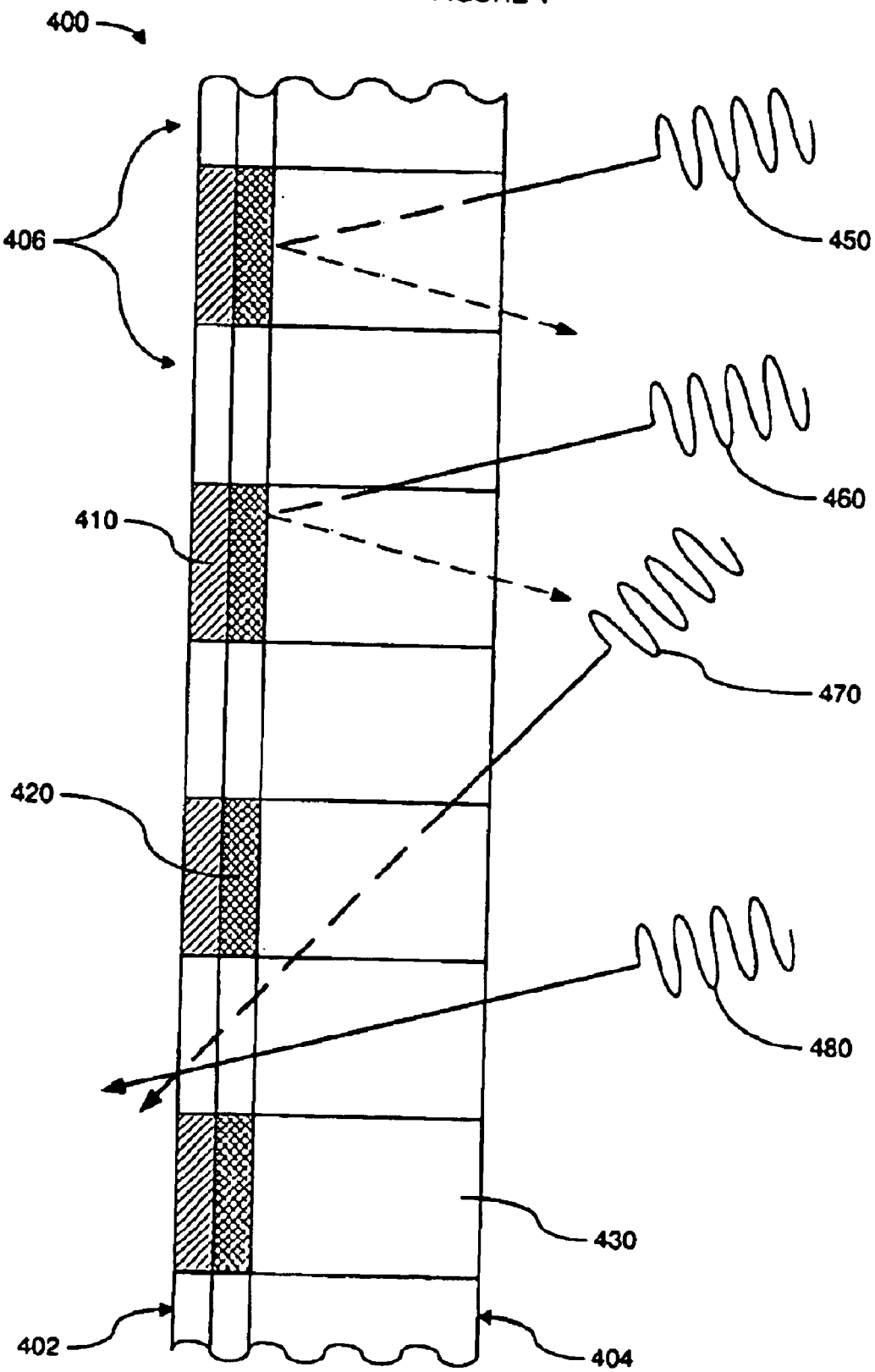
FIG. 4 is a cross sectional view of a part of a chassis of another embodiment.

FIG. 4 is a cross sectional view depicting features of another embodiment. Chassis section 400 is a portion of the exterior of a chassis of a device using airflow through the chassis of the device to cool internal components of the device. In a manner corresponding generally to the embodiment of bezel 300 depicted in FIG. 3, chassis section 400 is formed of three layers of material. The outer layer is comprised of chassis material 410 with an outer face 402 that is part of the visible exterior of the chassis. The middle layer is comprised of rubber sheet 420. The inner layer is comprised of foam sheet 430, and provides chassis section 400 with an inner face 404 that is on the side of chassis section 400 that is substantially opposite that of outer face 402. In one embodiment, rubber sheet 420 is attached to chassis material 410, and foam sheet 430 is attached to rubber sheet 420 with adhesive. In an alternative embodiment, fasteners are used. A plurality of air holes 406 are formed and provide substantially contiguous channels through chassis material 410, rubber sheet 420 and foam sheet 430 of chassis section 400, penetrating both outer face 402 and inner face 404.

As was the case with chassis material 210 of chassis section 200, chassis material 410 is typically some form of plastic, metal, composite, ceramic, wood, etc., depending on the material preferred for use on the given portion of the exterior of the chassis of which chassis portion 400 is a part. If chassis portion 400 is part of the front of the chassis of many typical computer systems or other electrical devices, it is likely that chassis material 410 would be plastic. If chassis portion 400 is part of one of the sides or rear of the chassis of many typical computer systems or other electrical devices, it is likely that chassis material 410 would be metal.

As was the case with rubber sheet 220 of chassis section 200, rubber sheet 420 could be made from rubber or from some form of plastic, polymer or other high-density foam material with some physical characteristics similar to rubber. In one embodiment, rubber sheet 420 is made of a material effective at reflecting sound waves of frequencies generally throughout the range of 500 Hz to 5 KHz, which is believed to be a range of frequencies to which the human ear is more sensitive.

Foam sheet 430 could be made from an open-cell type of foam material or other open-cell material, or that might commonly be described as being somewhat "sponge-like" in its consistency. In one embodiment, foam sheet 430 is made of a material effective in absorbing, or at least attenuating, sound waves of frequencies generally throughout the range of 500 Hz to 5 KHz, which is believed to be a range of frequencies to which the human ear is more sensitive.

Inner face 404 is positioned so as to face in the general direction of components within the chassis. As air is forced around surfaces of components within such a chassis, sound waves are generated that radiate from such component surfaces and towards the exterior of the chassis. Other sound waves may well be generated by one or more of the components, themselves, within such a chassis, including but not limited to, fans, blowers, disk drives power transformers, etc. The degree to which a given sound wave is reduced in energy and/or prevent from reaching the environment external to the chassis generally depends on where the given sound wave strikes chassis section 400, and at what angle.

Sound wave 450 depicts an example of a sound wave that is largely reduced and/or prevented from reaching the external environment. Sound wave 450 strikes inner face 404 provided by foam sheet 430 and enters into foam sheet 430. Foam sheet 430 absorbs a significant amount, if not all, of the energy of sound wave 450 as sound wave 450 passes through foam sheet 430. If sound wave 450 has sufficient energy so that some portion of sound wave 450 is able to penetrate all the way through foam sheet 430, then that portion of sound wave 450 strikes the surface of rubber sheet 420 that is in contact with foam sheet 430 and a significant amount of that portion of sound wave 450 is reflected back into foam sheet 430. The flexible characteristic of the material of rubber sheet 420 dampens the energy of the portion of sound wave 450 such that the reflected portion of sound wave 450 is of further reduced energy. The reflected portion of sound wave 450 may be significantly or entirely absorbed as it is reflected back through foam sheet 430. If the reflected portion of sound wave 450 has sufficient energy so that some last portion of sound wave 450 is able to penetrate all the way back through foam sheet 430, then that last portion will reenter the interior of the chassis, but will be of such significantly reduced energy that if that last portion eventually reaches the environment external to the chassis where it might be audible, the reduced energy results in that last portion being audible only at a considerably reduced volume.

Like sound wave 460, sound wave 450 also depicts an example of a sound wave that is largely reduced and/or prevented from reaching the external environment. Unlike sound wave 450, sound wave 460 does not strike foam sheet 430 at inner surface 404, but instead, strikes foam sheet 430 at a surface comprising part of the channel that defines one of the holes 406. In so doing, sound wave 460 does not pass through the same depth of the material of foam sheet 430 as did sound wave 450, and so sound wave 460 may not be as significantly reduced in energy if sound wave 460 is able to penetrate far enough to reach rubber sheet 420. Otherwise, the manner in which sound wave 460 is either completely or partially absorbed and/or reflected is similar to that of sound wave 450.

The flexible characteristic of the material of rubber sheet 420 also provides a degree of mechanical isolation between the surface of rubber sheet 420 that is in contact with foam sheet 430, and chassis material 410, allowing this surface of rubber sheet 420 to vibrate as would normally be expected in response to being struck by sound wave 450 or 460, while preventing a significant amount of this vibration from reaching chassis material 410. Preventing such vibration from reaching chassis material 410 aids in preventing chassis material 410 from also vibrating and thereby retransmitting sound wave 450 or 460 into the environment external to the chassis, and thereby possibly becoming audible.

Sound wave 470 depicts an example of a sound wave that might ultimately reach the external environment, but which is significantly reduced in energy by passing through foam sheet 430 before doing so.

Sound wave 480 depicts an example of a sound wave that is able to pass through chassis section 400. However, to do so, sound wave 480 must be sufficiently aligned with the angle of the channel defining one of holes 406. As those skilled in the art will understand, this indicates that the amount of sound waves able to pass through chassis section 400 in the same manner as sound wave 480 is affected by the geometry of the channels defining holes 406, such that if foam sheet 430 is made thicker, then fewer sound waves will be able to pass in this manner.

As was the case with air holes 306 of bezel 300, air holes 406 could be of almost any conceivable size, shape or placement across inner face 404. However, greater quantities and/or greater sizes of air holes 406 will necessarily result in less volume of material of foam sheet 430 being present to absorb sound waves, and result in less reflective surface area being provided by rubber sheet 420 to reflect sound waves. This circumstance may require that a tradeoff between the amount of air flow desired through chassis section 400 and the degree to which chassis section 400 is effective in preventing noise generated within a chassis from being heard outside the chassis. In one embodiment, air holes 406 are grouped such that a higher proportion of inner face 404 is intact at a point where an intact portion inner face 404 is more effective in reflecting a greater quantity of sound waves. In another embodiment, foam sheet 430 is made substantially thicker at a point where a greater volume of material of foam sheet 430 is more effective in absorbing a greater quantity of sound waves.

There may also be a tradeoff between the quantity of holes 406 in chassis section 400, and the size of each individual one of holes 406 relative to the thickness of foam sheet 430. It may be preferable to create a greater quantity of holes 406 with a smaller diameter for a given desired amount of airflow versus a smaller quantity of larger holes 406. Having holes 406 of a smaller size relative to the thickness of foam sheet 430 requires sound waves such as sound wave 480 to be directed at chassis section 400 at an angle that is more closely aligned with a given one of holes 406 in order to be able to pass through.

Figure 5:
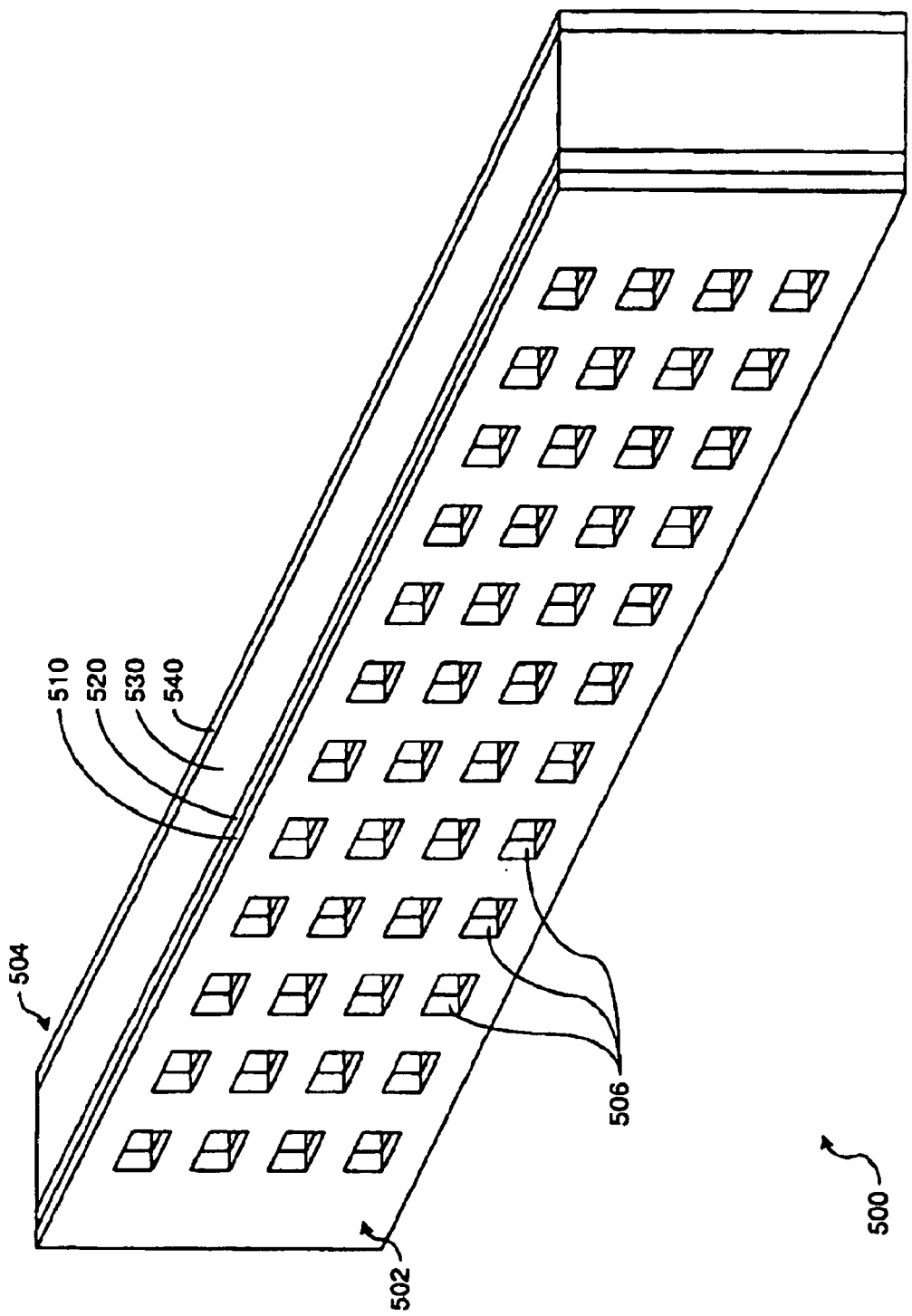
FIG. 5 is a perspective view of a bezel of still another embodiment.

FIG. 5 is a perspective view depicting features of still another embodiment. Somewhat like bezel 100 of FIG. 1, bezel 500 is a portion of the exterior of a chassis (not shown) of a device using airflow through the chassis of the device to cool internal components of the device. As shown in this embodiment, bezel 500 is substantially flat and is formed of four layers of material. The outermost layer is comprised of plate 510, and provides bezel 500 with an outer face 502 that becomes part of the visible exterior of a chassis when bezel 500 is installed. The next-to-outermost middle layer is comprised of rubber sheet 520. The next-to-innermost layer is comprised of foam sheet 530. Finally, the innermost layer is comprised of rubber sheet 540 and provides bezel 500 with an inner face 504 (not visible given the perspective shown) that is on the side of bezel 500 that is substantially opposite that of outer face 502. In one embodiment, rubber sheet 520 is bonded to plate 510, foam sheet 530 is bonded to rubber sheet 520, and rubber sheet 540 is bonded to foam sheet 530 with adhesive. A plurality of air holes 506 are formed and provide substantially contiguous channels through plate 510, rubber sheet 520, foam sheet 530, and rubber sheet 540, penetrating both outer face 502 and inner face 504.

As was the case with plate 310 of bezel 300, plate 510 is typically made of some form of plastic, metal, composite, ceramic, wood, etc., depending on the material preferred for use on the given portion of the exterior of a chassis of which bezel 500 is a part. As was the case with rubber sheet 320 of bezel 300, rubber sheets 520 and 540 could be made from rubber or from some form of plastic, polymer or other high-density foam material with some physical characteristics similar to rubber. As was the case with foam sheet 330 of bezel 300, foam sheet 530 could be made from an open-cell type of foam material or other open-cell material, or that might commonly be described as being somewhat "sponge-like" in its consistency. In one embodiment, rubber sheets 520 and/or 540 is made of a material effective at reflecting sound waves of frequencies generally throughout the range of 500 Hz to 5 KHz, and foam sheet 530 is made of a material effective in absorbing, or at least attenuating, sound waves of frequencies generally throughout the range of 500 Hz to 5 KHz.

When bezel 500 is installed as part of the exterior of a chassis of a device, inner face 504 is positioned so as to face in the general direction of components within the chassis. As air is forced around surfaces of components within such a chassis, sound waves are generated that radiate from such component surfaces and towards the exterior of the chassis. Other sound waves may well be generated by one or more of the components, themselves, within such a chassis, including but not limited to, fans, blowers, disk drives, power transformers, etc. Some of these sound waves reach bezel 500 and strike inner face 504 provided by rubber sheet 540. Rubber sheet 540 reflects a significant amount of these sound waves back towards the interior of the chassis, while dampening these reflected sound waves to some degree. Some of the sound waves that pass through rubber sheet 540 where holes 506 penetrate inner face 504, enter foam sheet 530 which absorbs a significant amount of these sound waves by dispersing their energy among the open-celled material of foam sheet 530. However, some of these sound waves may have sufficient energy so that some portion may be able to penetrate all the way through foam sheet 530 and reach rubber sheet 520. A significant amount of those sound waves that penetrate that far through foam sheet 530 are reflected by rubber sheet 520 back into foam sheet 530 where they are further absorbed by the open-celled material of foam sheet 530. The flexible characteristic of the material of rubber sheet 520 dampens the energy of these reflected sound waves, thereby further reducing their energy as they are reflected. The flexible characteristic of the material of rubber sheet 520 also provides a degree of mechanical isolation between the surface of rubber sheet 520 that is in contact with foam sheet 530 and plate 510, allowing this surface of rubber sheet 520 to vibrate as would normally be expected in response to sound waves striking it, while preventing a significant amount of this vibration from reaching plate 510. Preventing such vibration from reaching plate 510 aids in preventing plate 510 from also vibrating and thereby retransmitting sound waves into the environment external to the chassis where they might be audible. Furthermore, although some sound waves may have sufficient energy so that some portion may be able to penetrate through parts of foam sheet 530, possibly be reflected back into foam sheet 530 by rubber sheets 520 and/or 540, and then possibly reach the environment external to the chassis where they might be audible, their reduced energy results in their being audible only at a considerably reduced volume.

Although air holes 506 could be of almost any conceivable size, shape or placement across inner face 504, greater quantities and/or greater sizes of air holes 506 will necessarily result in less volume of material of foam sheet 530 being present to absorb sound waves, and result in less reflective surface area being provided by rubber sheets 520 and 540 to reflect sound waves.

Figure 6:
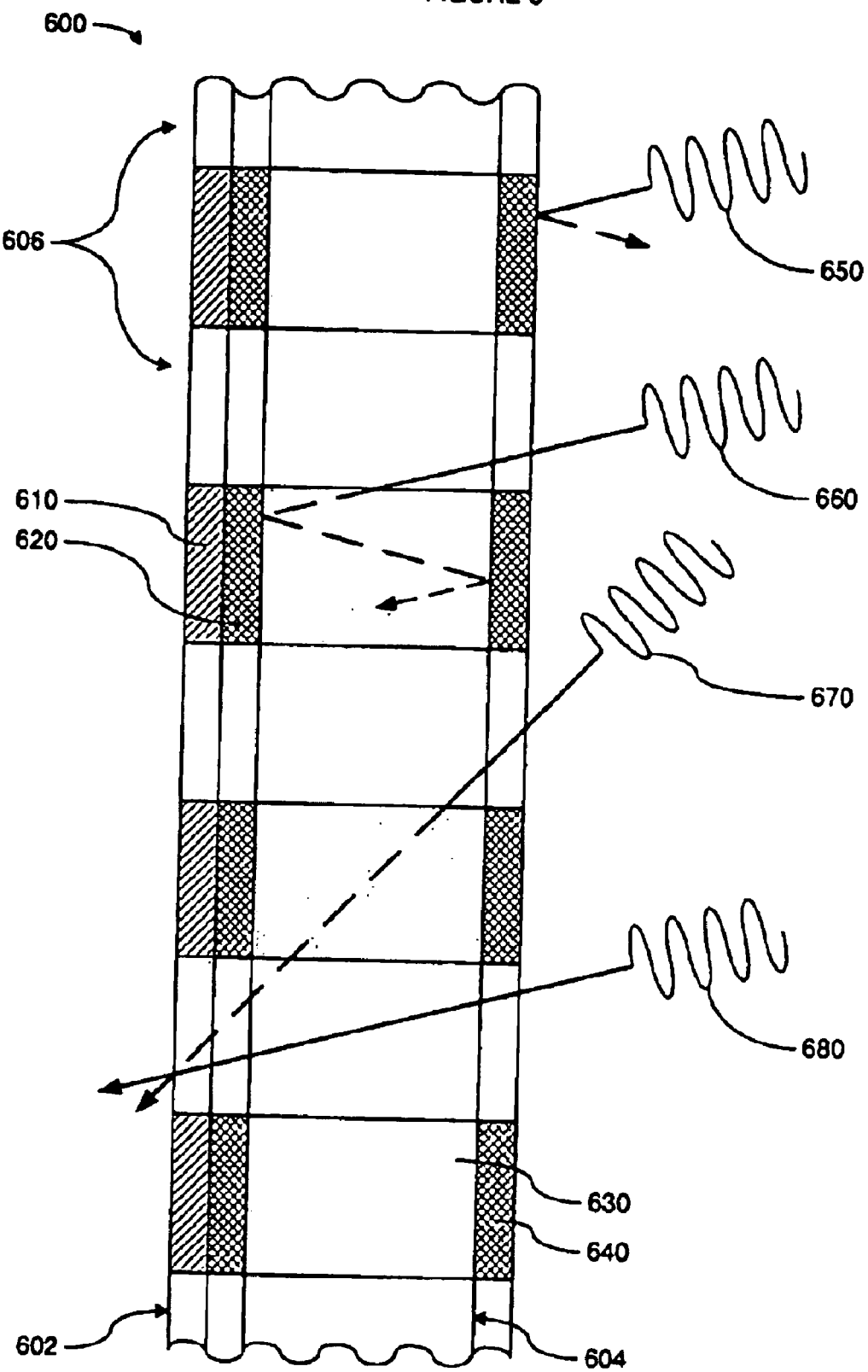
FIG. 6 is a cross sectional view of a part of a chassis of still another embodiment.

FIG. 6 is a cross sectional view depicting features of another embodiment. Chassis section 600 is a portion of the exterior of a chassis of a device using airflow through the chassis of the device to cool internal components of the device. In a manner corresponding generally to the embodiment of bezel 500 depicted in FIG. 5, chassis section 600 is formed of four layers of material. The outermost layer is comprised of chassis material 610 with an outer face 602 that is part of the visible exterior of the chassis. The next-to-outermost layer is comprised of rubber sheet 620. The next-to-innermost layer is comprised of foam sheet 630. Finally, the innermost layer is comprised of rubber sheet 640, and provides chassis section 600 with an inner face 604 that is on the side of chassis section 600 that is substantially opposite that of outer face 602. In one embodiment, rubber sheet 620 is attached to chassis material 610, foam sheet 630 is attached to rubber sheet 620, and rubber sheet 640 is attached to foam sheet 630 with adhesive. In an alternative embodiment, fasteners are used. A plurality of air holes 606 are formed and provide substantially contiguous channels through chassis material 610, rubber sheet 620, foam sheet 430 and rubber sheet 640 of chassis section 600, penetrating both outer face 602 and inner face 604.

As was the case with chassis material 410 of chassis section 400, chassis material 610 is typically some form of plastic, metal, composite, ceramic, wood, etc., depending on the material preferred for use on the given portion of the exterior of the chassis of which chassis portion 600 is a part. As was the case with rubber sheet 420 of chassis section 400, rubber sheets 620 and 640 could be made from rubber or from some form of plastic, polymer or other high-density foam material with some physical characteristics similar to rubber. As was the case with foam sheet 430 of chassis section 400, foam sheet 630 could be made from an open-cell type of foam material or other open-cell material, or that might commonly be described as being somewhat "sponge-like" in its consistency. In one embodiment, rubber sheets 620 and/or 640 is made of a material effective at reflecting sound waves of frequencies generally throughout the range of 500 Hz to 5 KHz, and foam sheet 430 is made of a material effective in absorbing, or at least attenuating, sound waves of frequencies generally throughout the range of 500 Hz to 5 KHz.

Inner face 604 is positioned so as to face in the general direction of components within the chassis. As air is forced around surfaces of components within such a chassis, sound waves are generated that radiate from such component surfaces and towards the exterior of the chassis. Other sound waves may well be generated by one or more of the components, themselves, within such a chassis, including but not limited to, fans, blowers, disk drives power transformers, etc. The degree to which a given sound wave is reduced in energy and/or prevent from reaching the environment external to the chassis generally depends on where the given sound wave strikes chassis section 600, and at what angle.

Sound wave 650 depicts an example of a sound wave that is largely prevented from reaching the external environment. Sound wave 650 strikes inner face 604 provided by rubber sheet 640. Rubber sheet 640 reflects a significant amount of sound wave 650 back towards the interior of the chassis. The flexible characteristic of the material of rubber sheet 640 dampens the energy of sound wave 650 such that if, after being reflected by rubber sheet 640, sound wave 650 eventually reaches the environment external to the chassis where sound wave 650 might be audible, the reduced energy of sound wave 650 results in sound wave 650 having a reduced volume.

Sound wave 660 depicts an example of a sound wave that is at least largely reduced, and also perhaps prevented from reaching the external environment. Unlike sound wave 650, sound wave 660 does not strike foam sheet rubber 640 at inner surface 604, but instead, strikes foam sheet 630 at a surface comprising part of the channel that defines one of the holes 606. Foam sheet 630 absorbs a significant amount, if not all, of the energy of sound wave 660 as sound wave 660 passes through at least a portion of foam sheet 630. If sound wave 660 has sufficient energy so that some portion of sound wave 660 is able to penetrate through foam sheet 630, then that portion of sound wave 660 strikes the surface of rubber sheet 620 that is in contact with foam sheet 630 and a significant amount of that portion of sound wave 660 is reflected back into foam sheet 630. The flexible characteristic of the material of rubber sheet 620 dampens the energy of the portion of sound wave 660 such that the reflected portion of sound wave 660 is of further reduced energy. The reflected portion of sound wave 660 may be significantly or entirely absorbed as it is reflected back through foam sheet 630. If the reflected portion of sound wave 660 has sufficient energy so that some last portion of sound wave 660 is able to penetrate through foam sheet 630, then depending on the location and angle of that last portion, that last portion may reenter the interior of the chassis, or may be reflected back into foam sheet 640 again as it strikes the surface of rubber sheet 640 that is in contact with foam sheet 630. If such contact with rubber sheet 640 is made, then the flexible characteristic of rubber sheet 640 will still further dampen the energy of that last portion. It may be that some remaining portion of sound wave 660 is able escape foam sheet 630 and reach the environment external to the chassis, but that remaining portion will be of such significantly reduced energy that could only be audible at a considerably reduced volume.

The flexible characteristic of the material of rubber sheet 620 also provides a degree of mechanical isolation between the surface of rubber sheet 620 that is in contact with foam sheet 630, and chassis material 610, allowing this surface of rubber sheet 620 to vibrate as would normally be expected in response to being struck by sound wave 660, while preventing a significant amount of this vibration from reaching chassis material 610. Preventing such vibration from reaching chassis material 610 aids in preventing chassis material 410 from also vibrating and thereby retransmitting sound wave 660 into the environment external to the chassis, and thereby possibly becoming audible.

Sound wave 670 depicts an example of a sound wave that might ultimately reach the external environment, but which will be significantly reduced in energy by passing through foam sheet 630 before doing so.

Sound wave 680 depicts an example of a sound wave that is able to pass through chassis section 600. However, to do so, sound wave 680 must be sufficiently aligned with the angle of the channel defining one of holes 606. As those skilled in the art will understand, this indicates that the amount of sound waves able to pass through chassis section 600 in the same manner as sound wave 680 is affected by the geometry of the channels defining holes 606, such that if foam sheet 630 is made thicker, then fewer sound waves will be able to pass in this manner.

As was the case with air holes 506 of bezel 500, air holes 606 could be of almost any conceivable size, shape or placement across inner face 604. However, greater quantities and/or greater sizes of air holes 606 will necessarily result in less volume of material of foam sheet 630 being present to absorb sound waves, and result in less reflective surface area being provided by rubber sheets 620 and 640 to reflect sound waves. This circumstance may require that a tradeoff between the amount of air flow desired through chassis section 600 and the degree to which chassis section 600 is effective in preventing noise generated within a chassis from being heard outside the chassis. In one embodiment, air holes 606 are grouped such that a higher proportion of inner face 604 is intact at a point where an intact portion inner face 604 is more effective in reflecting a greater quantity of sound waves. In another embodiment, foam sheet 630 is made substantially thicker at a point where a greater volume of material of foam sheet 630 is more effective in absorbing a greater quantity of sound waves.

There may also be a tradeoff between the quantity of holes 606 in chassis section 600, and the size of each individual one of holes 606 relative to the thickness of foam sheet 630. It may be preferable to create a greater quantity of holes 606 with a smaller diameter for a given desired amount of airflow versus a smaller quantity of larger holes 606. Having holes 606 of a smaller size relative to the thickness of foam sheet 630 would require sound waves such as sound wave 680 to be directed at chassis section 600 at an angle that is more closely aligned with a given one of holes 606 in order to be able to pass through.

The invention has been described in conjunction with the preferred embodiment. It is evident that numerous alternatives, modifications, variations and uses will be apparent to those skilled in the art in light of the foregoing description. Although the invention has been discussed repeatedly as being used in conjunction with the chassis of a device, it will be understood by those skilled in the art that the invention may be practiced in conjunction with other types of physical barriers used to restrict the passage of noise while allowing for the passage of air, including doors and walls for rooms in which devices generating white noise or other forms of noise may be contained. Although the embodiments discussed have included bezels that are substantially flat, it will be understood by those skilled in the art that bezels and/or plates comprising bezels may be curved, angled and/or folded, or may have any of a variety of contours or other decorative features without departing from the spirit and scope of the invention as hereinafter claimed.

Although two-layer embodiments have been described as incorporating rubber sheets or other similar material to reflect sound waves, two-layer embodiments of this invention may be practiced incorporating a foam sheet or other materials with characteristics similar to foam or other open-cell material to absorb sound waves, rather than to reflect them. Although embodiments with three or more layers have been depicted with differing layers of material to reflect and/or absorb sound waves in a particular alternating layered order, it will be understood that other orderings of layers of such material may be resorted to without departing from the spirit and scope of the invention as hereinafter claimed.

Although example embodiments have been depicted in figures with air holes of square cross-section, it will be understood that any of a variety of other shapes of air hole may be employed. Furthermore, although the example embodiments are described in the context of providing air holes for the passage of air flow caused by a blower or fan, there can be embodiments in which air flow brought about solely by convection.

What is claimed is:

1. A chassis, comprising:
   a source of audible noise within the chassis;
   a first layer comprised of material that forms at least a portion of the exterior of the chassis, and having a plurality of perforations formed therethrough; and a second layer adjacent to the first layer, comprised of a high-density flexible material, and having a plurality of perforations formed therethrough that align and cooperate with the plurality of perforations formed through the first layer to define a plurality of air holes that are contiguous to permit a flow of cooling air between the interior and exterior of the chassis to cool an electronic device within the chassis through the first and second layers.

2. The chassis of claim 1, wherein the high-density flexible material of the second layer reflects a sound wave generated by the source of audible noise towards the interior of the chassis that is substantially within the range of 500 Hz to 5 KHz.

3. The chassis of claim 1, wherein the material of the second layer is rubber.

4. The chassis of claim 1, wherein the material of the second layer is a high-density foam.

5. The chassis of claim 1, further comprising a third layer adjacent to the second layer and comprised of an open-cell material, wherein the plurality of air holes extend to form contiguous channels through the first, second and third layers to permit a flow of cooling air through the first, second and third layers, and wherein the open-cell material of the third layer forms a portion of the surface of each of the contiguous channels to absorb at least one sound wave striking said surface.

6. The chassis of claim 5, wherein the open-cell material absorbs a sound wave generated by the source of audible noise that is substantially within the range of 500 Hz to 5 KHz.

7. The chassis of claim 5, wherein the open-cell material is an open-cell foam.

8. The chassis of claim 5, wherein the thickness of the open-cell material is substantially greater than the width of at least one of the plurality of air holes so that at least one sound wave must be substantially aligned with the at least one air hole to pass through the air hole without being reflected by the second layer or absorbed by the third layer.

9. The chassis of claim 5, further comprising a fourth layer adjacent to the third layer and comprised of a high-density flexible material, and wherein the plurality of air holes extend to form contiguous channels through the first, second, third and fourth layers to permit a flow of cooling air through the first, second, third and fourth layers.

10. The chassis of claim 9, wherein the high-density flexible material of the fourth layer reflects a sound wave generated by the source of audible noise towards the interior of the chassis that is substantially within the range of 500 Hz to 5 KHz.

11. The chassis of claim 9, wherein the material of the fourth layer is rubber.

12. The chassis of claim 9, wherein the material of the fourth layer is a high-density foam.

13. A method comprising:
enclosing a source of audible noise within a chassis;
adding a first layer adjacent to an inner surface of a portion of the exterior wall of the chassis that is comprised of high-density flexible material;
forming a plurality of air holes that form contiguous channels through both the portion of the exterior wall of the chassis and the first layer; and
effecting a flow of cooling air to cool an electronic device with the chassis through the plurality of air holes.

14. The method of claim 13, further comprising selecting the high-density flexible material of the first layer to reflect a sound wave generated by the source of audible noise towards the interior of the chassis that is substantially within the range of 500 Hz to 5 KHz.

15. The method of claim 13, wherein adding the first layer comprises adding a layer of rubber.

16. The method of claim 13, wherein adding the first layer comprises adding a layer of high-density foam.

17. The method of claim 13, further comprising adding a second layer adjacent to the first layer that is comprised of an open-cell material and extending the air holes to form contiguous channels through the portion of the exterior wall of the chassis, the first layer and the second layer such that the open-cell material of the second layer forms a portion of the surface of each of the contiguous channels to absorb at least one sound wave striking said surface.

18. The method of claim 17, further comprising selecting the open-cell material to absorb a sound wave generated by the source of audible noise that is substantially within the range of 500 Hz to 5 KHz.

19. The method of claim 17, wherein adding the second layer comprises adding a layer of open-cell foam.

20. The method of claim 17, further comprising selecting the thickness of the open-cell material substantially greater than the width of at least one of the plurality of air holes so that at least one sound wave must be substantially aligned with the at least one air hole to pass through the air hole without being reflected by the first layer or absorbed by the second layer.

21. The method of claim 17, further comprising adding a third layer adjacent to the second layer that is comprised of a high-density flexible material and extending the air holes to form contiguous channels through the portion of the exterior wall of the chassis, the first layer, the second layer and the third layer to permit a flow of cooling air through the first, second and third layers.

22. The method of claim 21, further comprising selecting the high-density flexible material of the third layer to reflect a sound wave generated by the source of audible noise towards the interior of the chassis that is substantially within the range of 500 Hz to 5 KHz.

23. The method of claim 21, wherein adding the third layer comprises adding a layer of rubber.

24. The method of claim 21, wherein adding the third layer comprises adding a layer of high-density foam.

25. A bezel, comprising:
a first layer comprised of material that provides a surface that becomes part of an external surface of a chassis when the bezel is installed on the chassis, and having a plurality of perforations formed therethrough, wherein the chassis encloses a source of audible noise;
a second layer adjacent to the first layer, comprised of a high-density flexible material, and having a plurality of perforations formed therethrough that align and cooperate with the plurality of perforations formed through the first layer to define contiguous air holes to permit a flow of cooling air between the interior and exterior of chassis to cool an electronic device within the chassis through the first and second layers.

26. The bezel of claim 25, wherein the high-density flexible material of the second layer reflects a sound wave generated by the source of audible noise towards the interior of the chassis that is substantially within the range of 500 Hz to 5 KHz.

27. A chassis door for a chassis enclosing a source of audible noise, comprising:
a first layer comprised of material that provides a portion of the external face of the door, and having a plurality of perforations formed therethrough;

a second layer adjacent to the first layer, comprised of a high-density flexible material, and having a plurality of perforations formed therethrough that align and cooperate with the plurality of perforation formed through the first layer to define a plurality of air holes that are contiguous to permit a flow of cooling air between the interior and exterior of the chassis to cool an electronic device within the chassis through the first and second layers.

28. The chassis door of claim 27, wherein the high-density flexible material of the second layer reflects a sound wave generated by the source of audible noise towards the interior of the chassis that is substantially within the range of 500 Hz to 5 KHz.

29. The chassis door of claim 27, further comprising a third layer adjacent to the second layer and comprised of an open-cell material, and wherein the plurality of air holes extend to form contiguous channels through the first, second and third layers to permit a flow of cooling air through the first, second and third layers, and wherein the open-cell material of the third layer forms a portion of the surface of each of the contiguous channels to absorb at least one sound wave striking said surface.

30. The chassis door of claim 29, wherein the open-cell material is an open-cell foam.

31. The chassis door of claim 29, further comprising a fourth layer adjacent to the third layer and comprised of a high-density flexible material, and wherein the plurality of air holes extend to form contiguous channels through the first, second, third and fourth layers.

32. The chassis door of claim 31, wherein the high-density flexible material of the fourth layer reflects a sound wave generated by the source of audible noise towards the interior of the chassis that is substantially within the range of 500 Hz to 5 KHz.

* * * * *